United States Patent
Yeung et al.

(10) Patent No.: US 12,197,838 B2
(45) Date of Patent: Jan. 14, 2025

(54) SYSTEM AND METHOD FOR DETERMINING WIRING NETWORK IN MULTI-CORE PROCESSOR, AND RELATED MULTI-CORE PROCESSOR

(71) Applicant: THE UNIVERSITY OF HONG KONG, Hong Kong (HK)

(72) Inventors: Kwan Lawrence Yeung, Hong Kong (HK); Jie Xiao, Hong Kong (HK)

(73) Assignee: THE UNIVERSITY OF HONG KONG, Hong Kong (HK)

( * ) Notice: Subject to any disclaimer, the term of this patent is extended or adjusted under 35 U.S.C. 154(b) by 523 days.

(21) Appl. No.: 17/630,524

(22) PCT Filed: Aug. 7, 2019

(86) PCT No.: PCT/CN2019/099600
§ 371 (c)(1),
(2) Date: Jan. 27, 2022

(87) PCT Pub. No.: WO2021/022514
PCT Pub. Date: Feb. 11, 2021

(65) Prior Publication Data
US 2022/0318473 A1    Oct. 6, 2022

(51) Int. Cl.
*G06F 30/373*    (2020.01)
*G06F 30/331*    (2020.01)
*G06F 30/367*    (2020.01)

(52) U.S. Cl.
CPC .......... *G06F 30/373* (2020.01); *G06F 30/331* (2020.01); *G06F 30/367* (2020.01)

(58) Field of Classification Search
USPC .......................................................... 716/106
See application file for complete search history.

(56) References Cited

U.S. PATENT DOCUMENTS

| 2016/0182354 A1 | 6/2016 | De et al. |
| 2016/0182405 A1 | 6/2016 | Chen et al. |

(Continued)

FOREIGN PATENT DOCUMENTS

| CN | 110050256 A | * | 7/2019 | ............. G06F 17/16 |
| WO | WO-2018213438 A1 | * | 11/2018 | ........... G06F 15/803 |

OTHER PUBLICATIONS

International Search Report and Written Opinion for International Application No. PCT/CN2019/099600 mailed on May 8, 2020, 7 pages.

*Primary Examiner* — Mohammed Alam
(74) *Attorney, Agent, or Firm* — Amin, Turocy & Watson, LLP

(57) ABSTRACT

A computer-implemented method and system for determining a wiring network in a multi-core processor. The method includes determining, using a layered-and-progressive determination model, a wiring network including wiring path(s) for operably connecting multiple processor cores in the multi-core processor. The method also includes outputting a layout of the determined wiring network for display. The layered-and-progressive determination model is arranged to model the plurality of processor cores as a mesh of nodes arranged in the form of a rectangular array with n rows and m columns. Nested layer(s) are identified from the rectangular array. Each of the nested layers is formed by respective plurality of nodes connected in respective rectangular paths of the same shape but different sizes. A respective rectangular wiring path for each of the nested layer(s) is determined. The respective rectangular wiring paths are of the same shape but different sizes. If the nested layer(s) includes two or more layers, then for each of the respective rectangular wiring path, for each respective corner node of the respective rectangular wiring path, further rectangular wiring path(s) each connecting the respective corner node with (Continued)

at least one node in another one of the nested layer(s) is determined. The further rectangular wiring path(s) for each respective corner node are of the same shape but different sizes. The wiring network including the respective rectangular wiring paths and the further rectangular wiring paths is then formed.

20 Claims, 15 Drawing Sheets

(56) References Cited

U.S. PATENT DOCUMENTS

| | | | |
|---|---|---|---|
| 2016/0188777 A1* | 6/2016 | Bisht | G06F 30/398 |
| | | | 326/63 |
| 2016/0283429 A1 | 9/2016 | Wagh et al. | |
| 2017/0250926 A1* | 8/2017 | Chen | G06F 30/394 |
| 2018/0373677 A1* | 12/2018 | Jaber | G06F 15/803 |

* cited by examiner

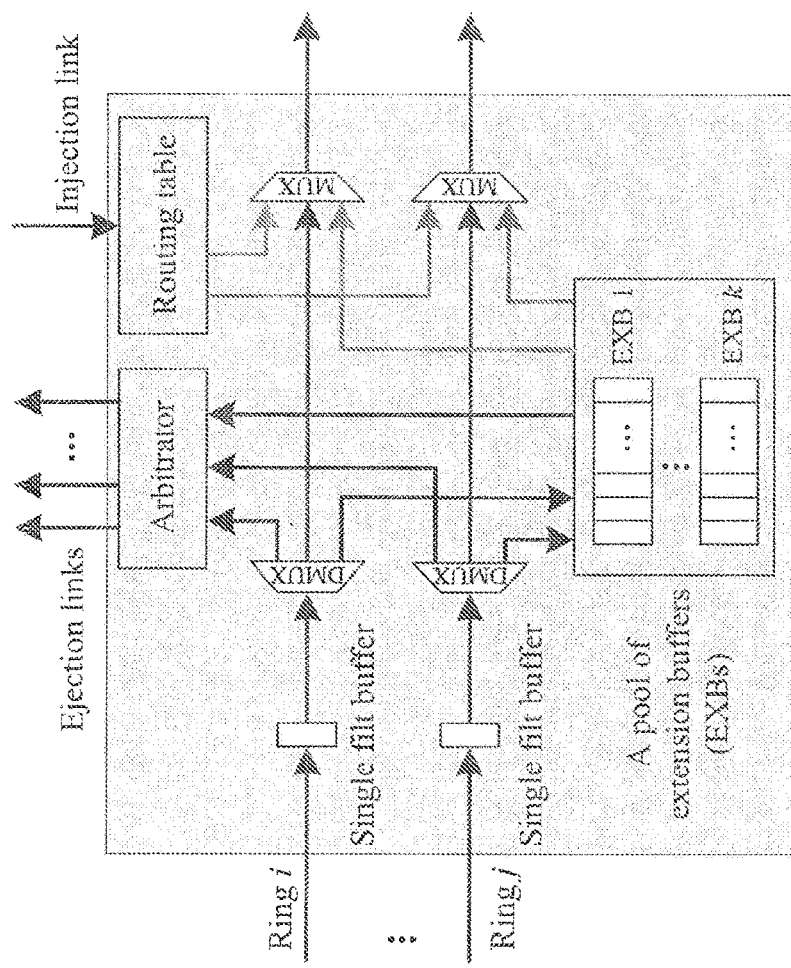

Algorithm 1: $Onion$ /*$Onion+$ is embedded*/ input: an $n \times n$ grid topology
begin
1. $\mathcal{R} = \emptyset$ /*initialize the ring set*/
2. for $layer = 1 \to \lfloor n/2 \rfloor$: /*$\lfloor \cdot \rfloor$ is a floor function*/
3.    $UL = (n+1) * (layer - 1)$ /*upper-left core*/
4.    $LR = n^2 - n * layer + n - layer$ /*lower-right core*/
5.    $\mathcal{R} = \mathcal{R} \cup \{<UL, LR, 0>\}$ /*outer ring*/
6.    for $i = 1 \to \lfloor LR/n \rfloor - \lfloor UL/n \rfloor - 1$:
7.      $\mathcal{R} = \mathcal{R} \cup \{<UL, LR - (n+1)*i, 1>\}$ /*upper-left ring*/
8.      $\mathcal{R} = \mathcal{R} \cup \{<UL + (n+1)*i, LR, 1>\}$ /*lower-right ring*/
9.      $\mathcal{R} = \mathcal{R} \cup \{<UL + i, LR - n * i, 1>\}$ /*upper-right ring*/
10.      $\mathcal{R} = \mathcal{R} \cup \{<UL + n * i, LR - i, 1>\}$ /*lower-left ring*/
11.    end for
12. end for
13. for $k = 1 \to \lfloor n/4 \rfloor$: /*only apply to $Onion+$*/
14.    $x = 2 * (k-1) * (n+1)$
15.    $\mathcal{R} = \mathcal{R} \cup \{<x+1, n^2 - 2 - x, 0>\}$ /*horizontal ring*/
16.    $\mathcal{R} = \mathcal{R} \cup \{<x + n, n^2 - n - x - 1, 0>\}$ /*vertical ring*/
17. end for
18. for $r$ in $\mathcal{R}$: /*greedy algorithm*/
19.    If $d_{avg}$ can decrease by reversing $r$, reverse $r$ in $\mathcal{R}$.
20.    Otherwise, keep $r$ unchanged and go to the next ring.
21. end for
22. return $\mathcal{R}$

Figure 7

SYSTEM AND METHOD FOR DETERMINING WIRING NETWORK IN MULTI-CORE PROCESSOR, AND RELATED MULTI-CORE PROCESSOR

TECHNICAL FIELD

The invention relates to system and method for determining wiring network in multi-core processor. The invention also relates to a multi-core processor and an information handling system incorporating such multi-core processor.

BACKGROUND

In traditional router-based network-on-chip (network-on-chip), powerful routers are required to provide the connectivity for tens, hundreds, or even thousands of processor cores (or processing units) on a chip multiprocessor. Without loss of generality, the following description focus on a "squared" chip with n×n cores that are interconnected using an n×n grid topology. Thus, each core, except those at the border, is connected with four neighbors, north, south, west and east, using a router.

FIG. 1 shows an existing 3×3 network-on-chip. This network-on-chip usually implemented using a (complicated) 5×5 crossbar switch as each router is also connected to the local core. In operation, the router selects an output to forward the packet based on the destination of a packet. If there are multiple packets going to the same output at the same time, packets losing contention will be buffered and a large router buffer size may be needed to prevent buffer overflow.

As the number of cores (e.g., the number of n) increases, more and more routers are required for operation. This in turn requires bigger die area and higher power consumption. It was shown that the routers in the Intel Teraflop processor (with 80 cores) consumed up to 17% of die area and 28% of the total power. As a result, network-on-chip topologies with fewer or no routers are highly desirable.

To reduce the number of routers, (directed) rings can be adopted. Cores connected by the same ring can communicate with each other without any intervening router. A passing-through ring has only one input and one output at a core. Based on the destination of a packet, the core only needs to make a simple local routing decision: ejecting the packet for receiving (if the destination addresses matches) or relaying it to the output. Due to its simplicity, a traditional router with large buffers and complicated crossbar switch fabric is no longer required. As an example, all cores on ring A in FIG. 2A can communicate along the anti-clockwise ring without going through any router. That said, packets may sometimes need to travel a longer distance to reach their destinations.

Various ring-based network-on-chip topologies, including hierarchical-ring, multi-mesh and torus-ring have been proposed. For cores that are connected by multiple rings, the ring that gives the shortest distance will be used. For cores that are not connected by any common ring, routers are still needed for relaying packets from one ring to another. As compared with the conventional (pure) router-based approach, the number of routers in these topologies is greatly reduced. However, with these topologies, the die area and power consumed by routers are still quite significant.

To eliminate the routers (which are relatively high cost), the idea of routerless network-on-chip (called IMR, Isolated Multiple Ring) has been recently proposed, e.g., in F. Alazemi, A. AziziMazreah, B. Bose, and L. Chen, "Routerless network-on-chip," 2018 *IEEE International Symposium on High Performance Computer Architecture (HPCA)*, 2018. In routerless network-on-chip, all core pairs are connected by at least one ring to ensure core-to-core connectivity. And because all rings are isolated, there is no inter-ring handover and the network-on-chip is routerless. From FIGS. 2A-2C, it can be seen that the core-to-core connectivity of the 3×3 chip (formed by 9 processor cores) is provided by three rings, A, B and C. Ring C is a rectangular ring while rings A & B are irregular rings that are not rectangular. Although these rings are drawn separately (for clarity), in practice they are superimposed. Therefore, there will be parallel links between adjacent cores. Let the maximum number of links allowed (or required) between any pair of adjacent cores be co, also known as wiring constraint (because each link consists of a given number of wires). The routerless network-on-chip in FIGS. 2A-2C meets the wiring constraint of $\omega=2$ because the maximum number of links required between adjacent cores is 2.

In a routerless network-on-chip, when one core needs to communicate with another core it will run a simple source routing algorithm to determine the ring that has the minimum distance to the destination. For example, when core 7 needs to communicate with core 6, ring C in FIG. 2C will be used because the hop distance between cores 6 and 7 is smallest: one (as opposed to seven on ring A). Intuitively, as wiring constraint co increases, more rings can be constructed and the average core-to-core distance can be reduced.

To implement routerless network-on-chip, the biggest challenge to date is to find a set of rings, under a given wiring constraint, that guarantees the core-to-core connectivity and minimize the average hop count for all core pairs. A simple approach is to find the optimal solution by enumerating all possible solutions. In a grid network, a ring can be either rectangle (e.g. ring C in FIG. 2C) or non-rectangle (e.g. rings A & B). It can be observed that rectangular rings are generally good at reducing core-to-core distance because each core can connect to about one half of the cores on the same using shortest paths, e.g. core 3 on ring C in FIG. 2C can reach cores 4, 5 and 8 using shortest paths. On the other hand, non-rectangular rings are good at ensuring connectivity among cores especially when wiring constraint co is small/tight. If $\omega=1$ and n is even, the optimal solution is a single non-rectangular ring connecting all $n^2$ cores, or a Hamiltonian cycle. (If n is odd, it can be shown that three rings are required.)

TABLE 1

Number of rings and non-rectangular rings in an n × n chip.

| | # of rings | # of non-rectangular rings |
|---|---|---|
| 2 | 2 | 0 |
| 3 | 26 | 8 |
| 4 | 426 | 354 |
| 5 | 18698 | 18498 |
| 6 | 2444726 | 2444276 |
| 7 | 974300742 | 974299860 |
| 8 | 1207683297862 | 1207683296294 |
| 9 | 4637054678922530 | 4637054678919938 |
| 10 | 54718528135833612202 | 54718528135833608152 |

When the chip size (or n) is very small, the number of different rings that can be constructed on an n×n grid network is limited, and the optimal solution can be found relatively easily by enumeration. However, as n increases, for example, to above 4, above 5, or above 6, or above 10, the number of rings, especially non-rectangular rings, increases super-exponentially. Table 1 shows the total possible number of rings and non-rectangular rings in an n×n chip. As shown in Table 1, the total number of rings in a 6×6 chip is 2,444,726 (and of which, 2,444,276 rings are non-rectangle). To find the optimal solution, every possible combination of the 2,444,726 rings must be examined. This is computationally difficult and inefficient.

An algorithm, called Evolving IMR, was developed for providing sub-optimal solution that partly addresses this issue. This algorithm is presented, e.g., in S. Liu, T. Chen, L. Li, X. Feng, Z. Xu, H. Chen, F. Chong, and Y. Chen, "IMR: high-performance low-cost multi-ring NoCs," *IEEE Transaction on Parallel and Distributed Systems*, vol. 27, no. 6, 2016. Problematically, however, solving Evolving IMR is still extremely slow and the solution found is also far from optimal. One of the biggest problem associate with Evolving IMR may be related to its assumption of no wiring constraint, or that co can be arbitrarily large, which can easily lead to impractical network-on-chip designs. Recently, an optimal integer linear programing ("ILP") formulation was proposed in J. Xiao, K. L. Yeung and S. Jamin, "ILP formulation for designing rings in routerless network-on-chip," *IEEE ICC*, 2019 for any n×m chips and under any given co, but this formulation only works when the chip size is very small.

Focusing on an n×n square chip with a fixed wiring constraints of ω=n, an algorithm called "RLrec" was proposed to address the above problems. US20170250926A discloses some details concerning the "RLrec" algorithm. Unlike Evolving IMR, "RLrec" only considers rectangular (including squared) rings. This simplification significantly reduces the solution space of, e.g., a 6×6 chip, from 2,444,726 different rings to only 450 rectangular rings. The routerless network-on-chip solution found by "RLrec" can achieve 9.5× reduction in power consumption, 7.2× reduction in die area, 2.5× reduction in zero-load packet latency, and 1.7× increase in throughput, when comparing with a traditional router-based network-on-chip. Specifically, "RLrec" adopts an inside-out layered approach in generating rectangular rings. An n×n chip is regarded as an extension of a smaller (n−2)×(n−2) chip by adding one outer layer of cores. Larger network-on-chips can thus be built recursively from smaller ones. For each newly added layer of cores, a new set of rectangular rings are constructed to guarantee their connectivity with all existing cores. The final network-on-chip solution consists of all the rectangular rings generated during the recursive process. It was shown that "RLrec" outperforms Evolving IMR in both average core-to-core hop distance and running time. However, "RLrec" can only handle chips with n×n cores, in which n must be even. In other words, e.g., "RLrec" cannot be easily used to solve the 3×3 chip in FIG. 1. Besides, "RLrec" only works for wiring constraint of ω=n, which the minimum wiring constraint.

SUMMARY OF THE INVENTION

It is an object of the invention to address the above needs, to overcome or substantially ameliorate the above disadvantages or, more generally, to provide an improved method for determining a wiring network in a multi-core processor such as a network-on-chip. It is also an object of the invention to provide a multi-core processor such as a network-on-chip that has an improved wiring network that provides reliable core-to-core connectivity with an optimal number of wiring paths between adjacent cores.

In accordance with a first aspect of the invention, there is provided a computer-implemented method for determining a wiring network in a multi-core processor, comprising: determining, using a layered-and-progressive determination model, a wiring network including one or more wiring paths for operably connecting a plurality of processor cores in the multi-core processor; and outputting the determined wiring network for display. The layered-and-progressive determination model is arranged to: model the plurality of processor cores as a mesh of nodes arranged in the form of a rectangular array with n rows and m columns (n is an integer larger than 2 and m is an integer larger than 2); identify, from the rectangular array, one or more (e.g., all) nested layers each formed by respective plurality of nodes connected in respective rectangular paths of the same shape but different sizes, the one or more nested layers include, at least, an outermost layer formed by all outermost nodes in the regular rectangular array; determine a respective rectangular wiring path for each of the one or more nested layers, wherein the respective rectangular wiring paths are of the same shape but different sizes; if the one or more nested layers includes two or more layers, determine, for each of the respective rectangular wiring path, for each respective corner node of the respective rectangular wiring path, one or more further rectangular wiring paths each connecting the respective corner node with at least one node in another one of the one or more nested layers, wherein the one or more further rectangular wiring paths for each respective corner node are of the same shape but different sizes; and form the wiring network using the respective rectangular wiring paths and, if the one or more nested layers includes two or more layers, the further rectangular wiring paths. The multi-core processor may be comprised of the plurality of processor cores, or it may include additional processor cores. The expression "rectangle" (or "rectangular") refers to any quadrilateral (or quadrilateral shape) with four right angles.

In one embodiment of the first aspect, the rectangular array is arranged such that the spacing between adjacent rows and the spacing between adjacent columns are the same.

Preferably, the layered-and-progressive determination model is further arranged to: determining respective direction of data flow in the respective rectangular wiring path for each of the one or more nested layers; and determining respective direction of data flow in the one or more further rectangular wiring paths for each respective corner node of the respective rectangular wiring path. Preferably, the data flow is unidirectional.

In one embodiment of the first aspect, the layered-and-progressive determination model is further arranged such that: the direction of data flow in the respective rectangular wiring path for each of the one or more nested layers is determined to be in a first direction, and the respective direction of data flow in the one or more further rectangular wiring paths for each respective corner node of the respective rectangular wiring path is determined to be in a second direction opposite to the first direction. The first direction may be a clockwise direction and the second direction may be an anti-clockwise direction, or vice versa.

Preferably, the determination of the respective rectangular wiring path for each of the one or more nested layers is performed in an outside-in manner beginning with the nodes in the outermost layer. If more layers are present, then the determination proceeds in an outside-in manner to the second outermost layer, subsequently to the third outermost layer, etc.

Preferably, the layered-and-progressive determination model is further arranged to: determine additional rectangular wiring paths for connecting the nodes in different layers, wherein the rectangular wiring paths are shaped differently than the respective rectangular wiring paths and the further rectangular wiring paths.

In one embodiment of the first aspect, the computer-implemented method further includes receiving one or more input parameters relating to a total number of processor cores in the multi-core processor, and the determination of the wiring network is performed based on the one or more received input parameters.

In one embodiment of the first aspect, n and m are different.

In another embodiment of the first aspect, n and m are the same such that the mesh of nodes are arranged in the form of a regular squared array, and the respective rectangular wiring paths and the further rectangular wiring paths are squared-shaped.

In one embodiment of the first aspect, n is at least 4, preferably at least 5, and more preferably at least 6. In one embodiment of the first aspect, m is at least 4, preferably at least 5, and more preferably at least 6.

In one embodiment of the first aspect, the layout of the determined wiring network includes all of the determined wiring paths superimposed with each other and on a model of the mesh.

In one embodiment of the first aspect, the determined wiring network, when applied or superimposed on the modelled mesh, has two axes of symmetry.

In one embodiment of the first aspect, the layout of the determined wiring network is free of non-rectangular wiring paths.

In one embodiment of the first aspect, the multi-core processor is routerless (and without crossbar switches).

In accordance with a second aspect of the invention, there is provided a system for determining a wiring network in a multi-core processor, comprising one or more processors arranged to perform the method of the first aspect. Preferably, the system further includes a display operably connected with the one or more processors for displaying the layout of the determined wiring network.

In accordance with a third aspect of the invention, there is provided non-transitory computer readable medium for storing computer instructions that, when executed by one or more processors, causes the one or more processors to perform the method of the first aspect.

In accordance with a fourth aspect of the invention, there is provided a multi-core processor comprising a plurality of processor cores operably connected with each other via a wiring network determined the method of the first aspect. Preferably, the multi-core processor further comprises a plurality of network interfaces each associated with a respective processor core for controlling data flow in the respective processor core.

In accordance with a fifth aspect of the invention, there is provided an integrated circuit comprising the multi-core processor of the fourth aspect.

In accordance with a sixth aspect of the invention, there is provided an information handling system comprising the multi-core processor of the fourth aspect. The information handling system may be a computer (desktop, laptop, tablet, etc.), a phone, a watch, an IoT device, etc.

In accordance with a seventh aspect of the invention, there is provided a computer-implemented method for determining a wiring network in a multi-core processor, comprising: determining, using a layered-and-progressive determination model, a wiring network including one or more wiring paths for operably connecting a plurality of processor cores in the multi-core processor; and outputting the determined wiring network for display. The layered-and-progressive determination model is arranged to: (i) model the plurality of processor cores as a mesh of nodes in the form of an array; (ii) identity, from the array, one or more nested layers each formed by respective plurality of nodes connected in respective paths of the same shape but different sizes, the one or more nested layers include, at least, an outermost layer formed by all outermost nodes in the array; (iii) determine a respective wiring path for each of the one or more nested layers, wherein the respective wiring paths are of the same shape but different sizes; (iv) if the one or more nested layers includes two or more layers, determine, for each of the respective wiring path, at one or more nodes of the respective wiring path, one or more further wiring paths each connecting the respective one or more nodes with at least one node in another one of the one or more nested layers, wherein the one or more further wiring paths for each respective corner node are of the same shape but different sizes; and (v) form the wiring network using the respective wiring paths and, if the one or more nested layers includes two or more layers, the further wiring paths.

In one embodiment of the seventh aspect, the array is in the form of a rectangle, and all the wiring paths are rectangular (including square). In this case, the resulting method becomes the method of the first aspect.

In an alternative embodiment of the seventh aspect, the array is in the form of a polygon with three or more edges (e.g., triangle, quadrilateral, pentagon, hexagon, etc.). In this case, the array is in the form of such polygon, and all the wiring paths in the form of such polygon. The method of the first aspect applies similarly (by replacing the reference "rectangle" or "rectangular" with "polygon" or "polygonal").

In yet another embodiment, the array is in the form of a circle, oval, ellipse, oblong, etc. In this case, the array is in the form of such rounded shape, and all the wiring paths in the form of such rounded shape.

BRIEF DESCRIPTION OF THE DRAWINGS

Embodiments of the invention will now be described, by way of example, with reference to the accompanying drawings in which:

FIG. 3 shows a routerless network-on-chip network interface for a processor core in one embodiment of the invention;

FIG. 7 shows an algorithm ("Onion" and "Onion+") for determining a wiring network in a multi-core processor in one embodiment of the invention.

DETAILED DESCRIPTION OF THE PREFERRED EMBODIMENT

Figure 12:
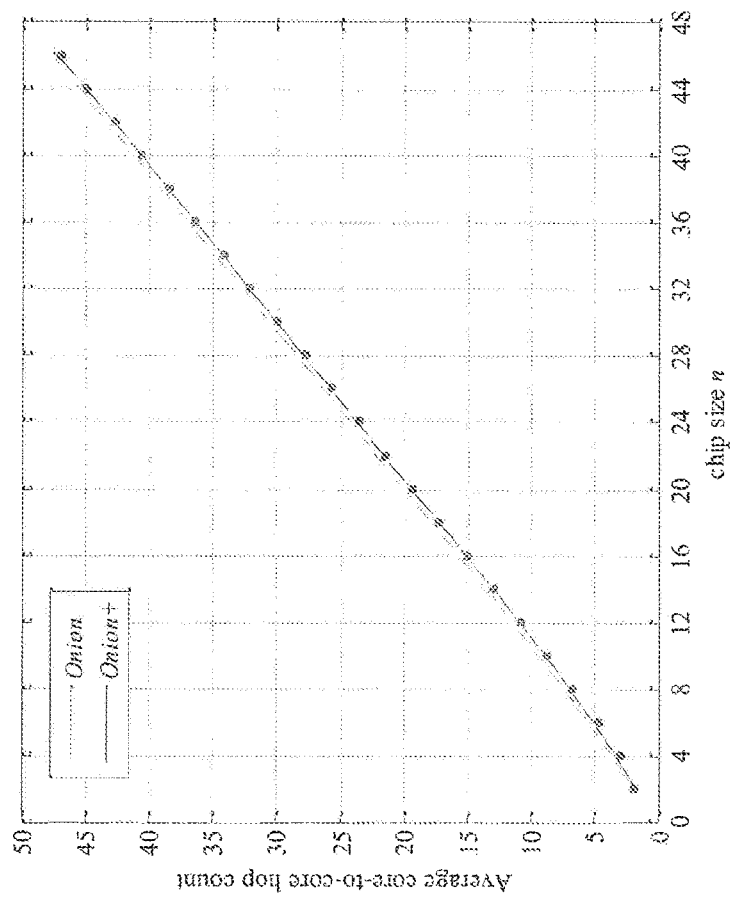
FIG. 12 is a polynomial curve fitting for the algorithm ("Onion" and "Onion+") of FIG. 7 in one embodiment of the invention.
Figure 13:
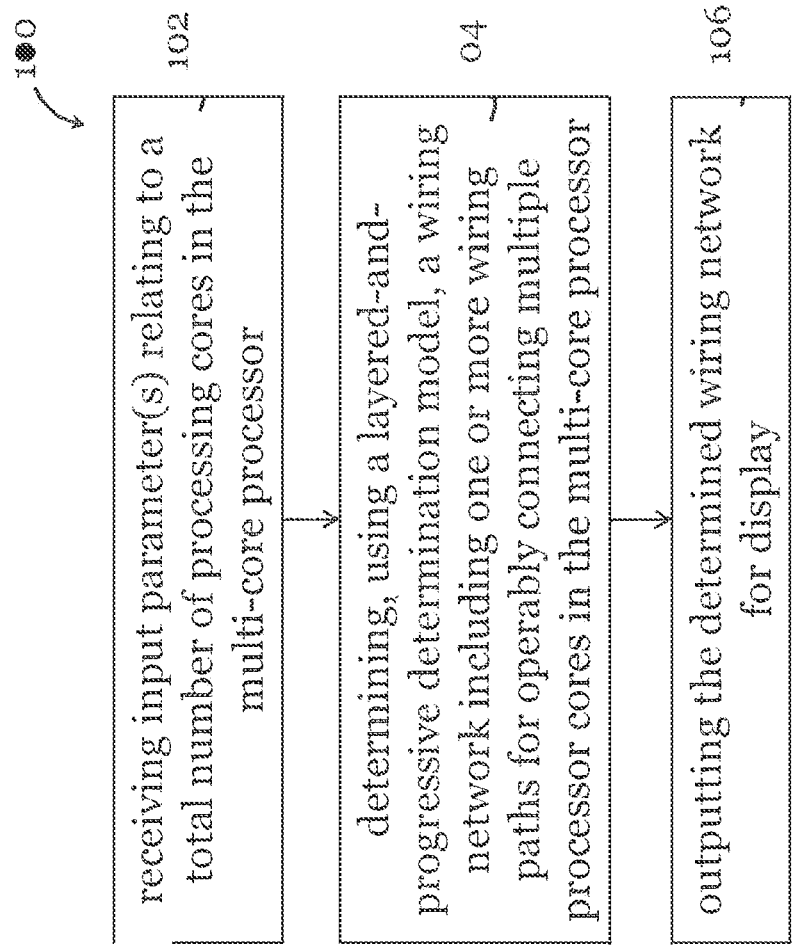
FIG. 13 is a flow chart showing a method for determining a wiring network in a multi-core processor in one embodiment of the invention.

FIG. 13 shows a method 100 for determining a wiring network in a multi-core processor such as one that is routerless (and without crossbar switches). The method 100 is preferably a computer implemented method. The method begins in step 102, in which input parameter(s) relating to a total number of processing cores in the multi-core processor is received. For example, the input parameters may be the total number of processing cores in the multi-core processor, or may be a number of row and a number of column of total number of processing cores in the multi-core processor. After receiving the input parameters(s), the method 100 proceeds to step 104, to determine, using a layered-and-progressive determination model, a wiring network including one or more wiring paths for operably connecting multiple processor cores in the multi-core processor. Embodiments of the layered-and-progressive determination model are described below with respect to FIGS. 3 to 12. After the determination, the method proceeds to step 106 to output the determined wiring network for display.

In one general embodiment, the layered-and-progressive determination model is arranged to model the plurality of processor cores as a mesh of nodes arranged in the form of a regular rectangular array. The array may have n rows and m columns (n is an integer larger than 2 and m is an integer larger than 2). The model may also identify, from the rectangular array, one or more nested layers each formed by respective plurality of nodes connected in respective rectangular paths of the same shape but different sizes. In other words, the rectangular array is identified with outer and inner layers (e.g., like an "onion"). The model is also arranged to determine a respective rectangular wiring path for each of the nested layer. Naturally, the respective rectangular wiring paths would be of the same shape but different sizes. In some embodiments, if the number of nested layers is at least two, then the model also determines, for each of the respective rectangular wiring path, for each respective corner node of the respective rectangular wiring path, one or more further rectangular wiring paths each connecting the respective corner node with at least one node in another one of the nested layers. Here, the one or more further rectangular wiring paths for each respective corner node are of the same shape but different sizes. After the determination, the model would then form the wiring network using the respective rectangular wiring paths and the further rectangular wiring paths. The multi-core processor may be comprised of the plurality of processor cores, or it may include additional processor cores. The layered-and-progressive determination model is preferably also arranged to determine respective direction of data flow in the respective rectangular wiring path for each of the nested layer(s); and to determine respective direction of data flow in the further rectangular wiring path(s) for each respective corner node of the respective rectangular wiring path. Preferably, the data flow is unidirectional. As an example, the direction of data flow in the respective rectangular wiring path for each of the nested layer may be anticlockwise while the respective direction of data flow in the further rectangular wiring path(s) for each respective corner node of the respective rectangular wiring path may be clockwise.

In some embodiments of the model, the determination of the respective rectangular wiring path for each of the nested layer(s) is performed in an outside-in manner beginning with the nodes in the outermost layer. If more layers are present, then the determination proceeds in an outside-in manner to the second outermost layer, subsequently to the third outermost layer, etc.

It is possible, in some cases, that the layered-and-progressive determination model further determines additional rectangular wiring paths for connecting the nodes in different layers. These rectangular wiring paths, same shape and different sizes, would be shaped differently than the respective rectangular wiring paths and the further rectangular wiring paths.

In step 106, the layout may include all of the determined wiring paths superimposed with each other and on a model of the mesh. Preferably, the determined wiring network, when applied or superimposed on the modelled mesh, has two axes of symmetry. Preferably, the layout of the determined wiring network is free of non-rectangular wiring paths.

Various variants of the model are possible. For example, n and m can be different, or n and m can be the same. If n and m are the same then the mesh of nodes are arranged in the form of a regular squared array, and the respective rectangular wiring paths and the further rectangular wiring paths are squared-shaped.

The following description provides specific embodiments of the layered-and-progressive determination model of the invention.

I. Routerless NOC Architecture

A. Network Interface

FIG. 3 shows a routerless network-on-chip network interface at each core of the routerless network-on-chip. Each of the cores does not need a router, but a network interface as shown in FIG. 3 to interact with all the rings passing through it. Specifically, in this embodiments, wormhole switching mode is to adopted and each packet is broken into small pieces, called flits (flow control units), for transmission. The first flit of a packet is header flit. It contains the destination address of the packet. When the header flit arrives at an interface, it will set up the transmission behavior for all subsequent flits of the packet. The header flit is followed by one or more data flits, which contain the packet payload. The last flit is tail flit. Tail flit signals the interface to end the current packet forwarding behavior. All flits of the same packet are forwarded back-to-back at the speed of one hop per clock cycle. They are also injected/sent or ejected/received at the speed of one flit per clock cycle.

As shown in FIG. 3, the network interface of each core has (a) an injection link for the core (not shown) to send packets into a selected ring, (b) one or more ejection links for (concurrent) packet receiving, (c) an arbitrator for selecting packets with the earliest arrival time to eject first, (d) a hard-wired routing table for identifying the ring whose distance to the destination core is the shortest, (e) a multiplexer (MUX) and (f) a demultiplexer (DMUX) for multiplexing/demultiplexing packets to/from each ring, (g) a single flit buffer at each ring input for header flit processing, and (h) a shared pool of extension buffers (EXBs) for storing packets when contention occurs. Note that each EXB is dimensioned to store a single largest packet.

B. Packet Forwarding, Ejection and Injection

Each network interface is arranged to perform three major tasks: packet forwarding, ejection, and injection.

Forwarding: If the destination of the newly arrived header flit is not the current core, the packet will be forwarded to the output port (for the next core along the ring) immediately. If the output port is busy with a packet injection, the header flit, as well as the data flits followed, will be detained in an EXB for forwarding later on. (To ensure there is always an idle EXB, the core will inject a packet only if there is at least one idle EXB.)

Ejection: If the destination of the header flit is the current core, the packet will be ejected via an idle ejection link. If all the ejection links are busy, the packet will be detained in an EXB and compete for ejection in the next clock cycle. In case that all EXBs are occupied, the header flit (and the subsequent data flits) will be deflected to the next core along the ring, with the understanding that it will be looped back later on. In this case, the network is used as a temporary packet buffer.

Injection: When a packet is to be injected, based on the hard-wired routing table, it will be directed to the ring whose distance to the destination core is the shortest. If there is at least one idle EXB, the packet will be injected immediately; otherwise, the packet will wait at the buffer of the core. During the injection process, newly arrived flits will either be ejected or detained in some idle EXBs.

With the forwarding, ejection and injection processes above, a successfully injected packet is guaranteed to reach the destination without being dropped en route. However, the exact delay-throughput performance also relies on the number of ejection links and EXBs adopted at each core.

C. Problem Formulation

To implement routerless network-on-chip, the biggest challenge, as identified in the background, is to determine a wiring network (e.g., a set of wiring rings) that guarantee core-to-core connectivity, minimize the average hop count for all core pairs, and does not violate a given wiring constraint. As pointed out above, the intuitive approach of enumerating all possible combination of all possible rings is not feasible, not scalable, hence not practical.

As the number of rectangular rings is dramatically smaller than the number of all possible rings, and each core can reach about half of the cores on the same rectangular ring by shortest distance (like "RLrec"), the following disclosure focus on using rectangular rings.

For a given n×n chip with wiring constraint co, the problem of ring construction can be formulated as: finding a set of rectangle rings to minimize the average core-to-core hop count. There are two constraints: Connectivity requirement: each pair of cores must be connected by at least one rectangle ring; and Wiring constraint: the maximum number of links between any pair of adjacent cores cannot exceed co.

II. Onion & Onion+ Algorithms

A. "Onion" Algorithm

This embodiment focus on the wiring constraint of $\omega=n-1$, where n is the number of cores in each row/column of an n×n chip. No feasible solutions using rectangular rings can be found if $\omega<n-1$, as will be discussed in the following paragraphs. So $\omega=n-1$ is the minimum wiring constraint for rectangular rings.

To guarantee the core-to-core connectivity and minimize the average hop count for all core pairs in an n×n chip, a wiring network (e.g., wiring rings) construction algorithm called "Onion" is presented in this embodiment. "Onion" consists of 3 processes: layering of cores, ring construction and optional (ring) direction tuning.

Figure 1:
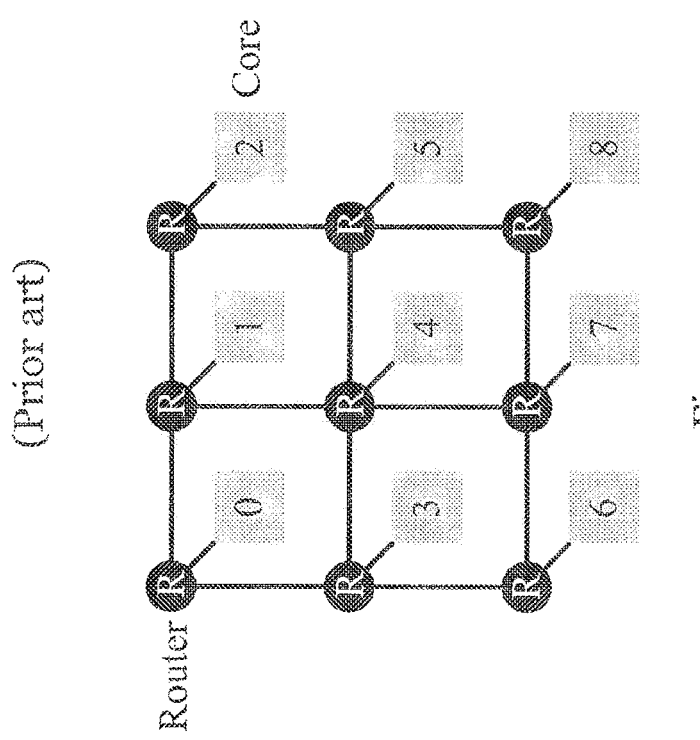
FIG. 1 is an existing router-based 3×3 network-on-chip, with each wiring path being bidirectional, consisting of parallel wires for sending bits in parallel.
Figures 2A, 2B, 2C:
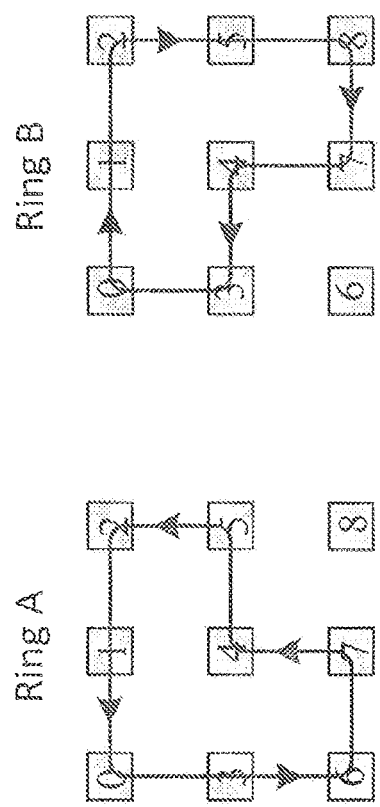
FIG. 2A shows a ring A for realizing routerless network-on-chip in the 3×3 network-on-chip of FIG. 1.
FIG. 2B shows a ring B for realizing routerless network-on-chip in the 3×3 network-on-chip of FIG. 1.
FIG. 2C show a ring C for realizing routerless network-on-chip in the 3×3 network-on-chip of FIG. 1.
Figure 4B:
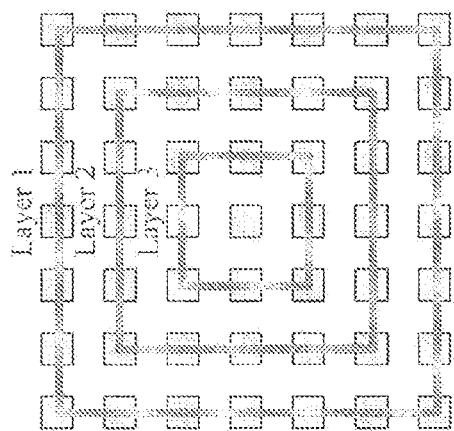
FIG. 4B shows a 7×7 chip having three layers of cores.
Figure 4A:
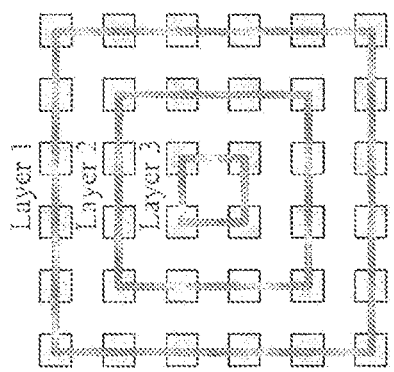
FIG. 4A shows a 6×6 chip having three layers of cores.

Layering of cores: The $n^2$ cores of an n×n chip always can be divided into [n/2] nested layers, where '⌊ ⌋' is a floor function. As shown in FIGS. 4A and 4B, both the 6×6 chip and the 7×7 chip have three layers of cores. Without loss of generality, Layer 1 consists of the cores at the outermost layer. If Layer 1 cores are removed, the new outmost layer of cores forms Layer 2. By repeating the process, each subsequent layer becomes smaller and smaller. If n is even (see FIG. 4A), the last/innermost layer is a 2×2 grid. If n is odd (see FIG. 4B), the last layer is the outermost layer of a 3×3 grid. In the latter case, it is considered that the core at the center of the chip does not belong to any layer. Since the layering process above is similar to peeling an onion, the resulting algorithm is called "Onion".

Ring construction: FIGS. 5A-5L present an example of how to construct square rings in a layered progressive manner. Starting from Layer 1 (see FIGS. 5A-5E), a set of square rings are generated to guarantee (1) the connectivity among all cores in the current layer (i.e., cores shown with oblique lines in FIGS. 5A-5E) using a single anti-clockwise square ring (in red), and (2) the connectivity between any core in the current layer and any core surrounded by the current layer, using 4 sets of smaller, clockwise square rings (colored in blue, green, pink and orange in FIGS. 5A-5E). Note that each set is originated from one of the 4 corners of the current layer. The process repeats for Layer 2 (see FIGS. 5F to 5J).

As a result, every core in the current layer will be connected with every other core in the current layer or surrounded by the current layer. When the rings are constructed for every layer following the same process, the resulting topology—formed by superimposing all rings found (see FIG. 5L)—guarantees that every core in the chip is connected with every other core.

Figure 5A:
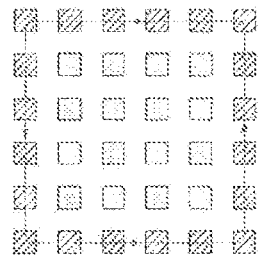
FIG. 5A shows the construction of an outer ring for Layer 1 of a 6×6 network-on-chip in one embodiment of the invention.
Figure 5B:
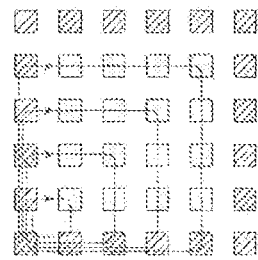
FIG. 5B shows the construction of upper-left rings for Layer 1 of a 6×6 network-on-chip in one embodiment of the invention.
Figure 5C:
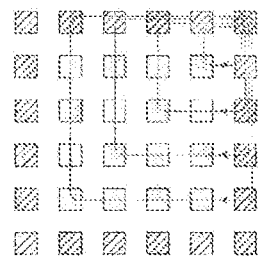
FIG. 5C shows the construction of lower-right rings for Layer 1 of a 6×6 network-on-chip in one embodiment of the invention.
Figure 5D:
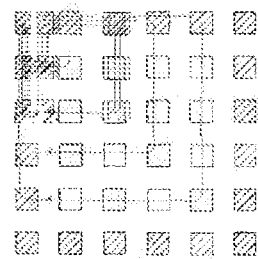
FIG. 5D shows the construction of upper-right rings for Layer 1 of a 6×6 network-on-chip in one embodiment of the invention.
Figure 5E:
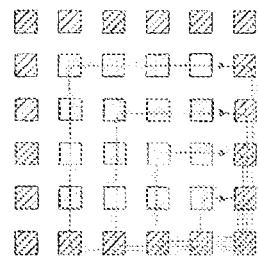
FIG. 5E shows the construction of lower-left rings for Layer 1 of a 6×6 network-on-chip in one embodiment of the invention.
Figure 5F:
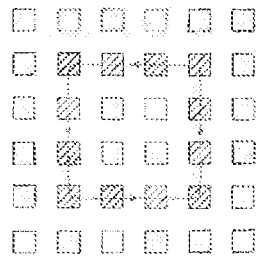
FIG. 5F shows the construction of an outer ring for Layer 2 of the 6×6 network-on-chip in one embodiment of the invention.
Figure 5G:
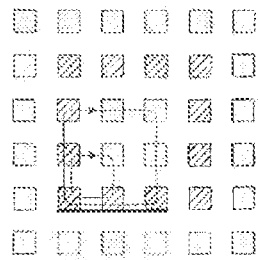
FIG. 5G shows the construction of upper-left rings for Layer 2 of a 6×6 network-on-chip in one embodiment of the invention.
Figure 5H:
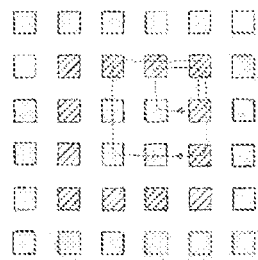
FIG. 5H shows the construction of lower-right rings for Layer 2 of a 6×6 network-on-chip in one embodiment of the invention.
Figure 5I:
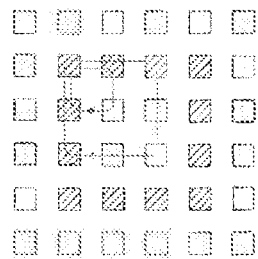
FIG. 5I shows the construction of upper-right rings for Layer 2 of a 6×6 network-on-chip in one embodiment of the invention.
Figure 5J:
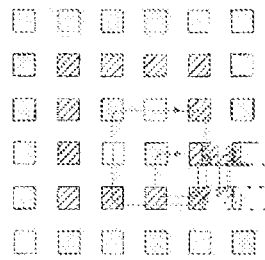
FIG. 5J shows the construction of lower-left rings for Layer 2 of a 6×6 network-on-chip in one embodiment of the invention.
Figure 5K:
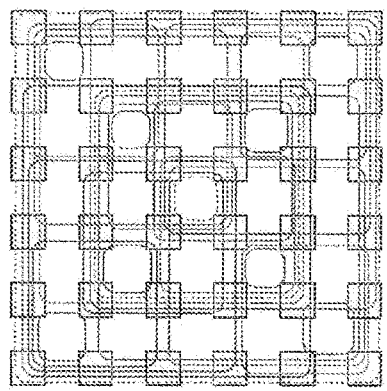
FIG. 5K shows the construction of an outer ring for Layer 3 of the 6×6 network-on-chip in one embodiment of the invention.
Figure 5L:
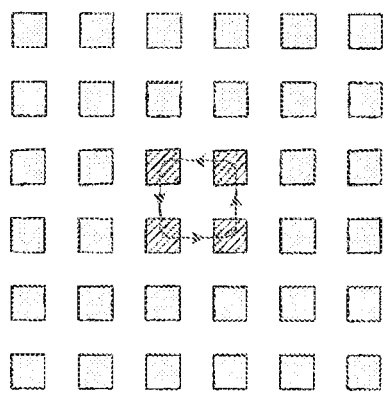
FIG. 5L shows the construction of all the generated rings of FIGS. 5A-5K in one embodiment of the invention.

From FIG. 5L, it can be seen that the number of links between adjacent cores is at most $\omega=n-1$. Besides, all cores belonging to the same layer are connected with each other using $(n-1)$ intra-layer links. Therefore, each core (except those at Layer 1) is connected with two neighbors in the same layer using $(n-1)$ intra-layer links each, and two neighbors at other layers (above/below) using no more than $(n-1)$ inter-layer links each. It can be seen that if n is odd, the center core (who does not belong to any layer) is connected with $4(n-1)$ links, the largest among all cores. If n is even, the four cores at the innermost layer have the largest number of connected links, or $4(n-1)-2$ links each, consisting of both intra- and inter-layer links. No matter n is even or odd, the four corner cores of Layer 1 always have the smallest number of (intra-layer) links, or $2(n-1)$.

As compared with "RLrec", because of the intrigue topological properties above, "Onion" can conveniently cut down the average core-to-core hop count by more than 10%, as will be discussed later.

Direction tuning: The purpose of this optional step is to further improve the average core-to-core hop count by judiciously tuning the direction of rings found in the ring construction process, clockwise or anti-clockwise. But examining all possible solutions, i.e., all possible direction combinations of all the rings found, for optimal direction tuning is too also complicated. Therefore, a simple greedy approach is adopted in "Onion".

Figure 6:
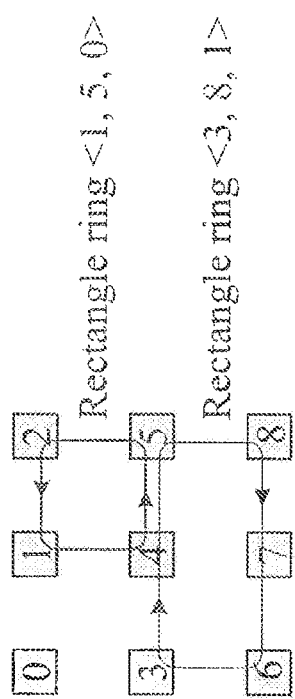
FIG. 6 illustrates a notation for denoting rectangular rings in one embodiment of the invention.

Before delving into the details of the present "Onion" algorithm, a new notation for representing rectangular ring is first defined. Without loss of generality, let cores in an n×n grid be numbered from left to right and top to bottom, as shown in FIG. 6. Each rectangular ring then can be uniquely identified by a 3-tuple <x, y, b>, where x (or y) is the core with the smallest (or largest) core ID among all the cores in the rectangular ring, and binary variable b denotes whether the ring direction, clockwise (b=1) or anti-clockwise (b=0). Accordingly, the two rectangular rings in FIG. 6 can be represented by <1, 5, 0> and <3, 8, 1>. It is also interesting to note that core x (or y) is always located at the upper-left (or lower-right) corner of the corresponding rectangular ring.

Referring to Algorithm 1 in FIG. 7, an embodiment of the "Onion" algorithm is summarized by the pseudo codes presented. The algorithm generally includes two parts (where layering of cores is excluded): Lines 3-13 are responsible for ring construction, and Lines 19~22 for (optional) direction tuning. (Lines 14-18 are for a variant of the algorithm called "Onion+" and will be discussed later). For ring construction, Line 6 generates the (largest/red) outer ring connecting all the cores in the current layer. Lines 8~11 construct the 4 sets of (smaller) square rings, one from each corner of the current layer. Notably, as i in Line 7 increases, the size of the rings constructed decreases. Finally, all rings constructed are stored in R using the three-tuple notation defined earlier.

Lines 19-22 in FIG. 7 provide a greedy algorithm for fine tuning the direction of each rectangular ring in R. Rings in R are examined one by one, following the same order as they have been constructed. Recall that the ring construction process is outside-in (where outer layers are considered first) and at each layer, larger rings are constructed first. As a result, the greedy algorithm will generally tune the direction of larger rings first. This is intuitively appealing because larger rings tend to have a bigger impact on average core-to-core hop count (i.e., $d_{avr}$ in Line 20). The direction of a ring is reversed if resulting $d_{avr}$ is smaller/improved.

B. "Onion+" Algorithm

For an n×n chip, "Onion" requires a wiring constraint of $\omega=n-1$. But the prior solution "RLrec" needs a wiring constraint of $\omega=n$. In order to provide fair comparison with "RLrec", the wiring constraint of "Onion" is increased from $(n-1)$ to n, providing some additional wiring resources for constructing more rings. Therefore, "Onion" is extended by Lines 14~-8 in Algorithm 1 of FIG. 7 for constructing additional rings. This variant algorithm is called "Onion+".

Figure 8B:
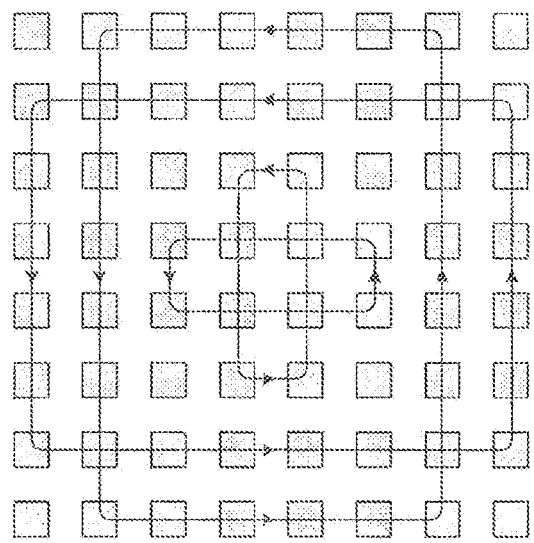
FIG. 8B shows additional rings for the 8×8 network-on-chip generated by the optional part of the algorithm of FIG. 7.
Figure 8A:
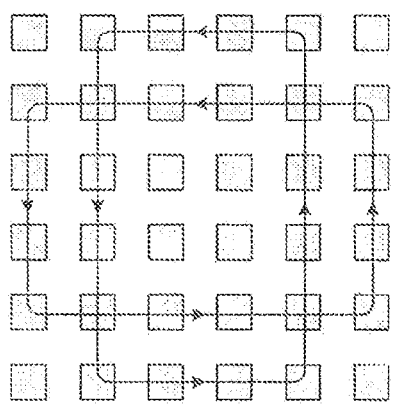
FIG. 8A shows additional rings for the 6×6 network-on-chip generated by the optional part of the algorithm of FIG. 7.

From Lines 14-18, it can be seen that [n/4] pairs of additional anti-clockwise rectangular rings will be constructed. Each pair consists of one horizontal rectangular ring and one vertical rectangular ring, and the two rings intersect to form a "+", as shown in FIG. 8A. If the chip multiprocessor has more cores, e.g., 64 in FIG. 8B, nested "+" can be constructed.

C. Discussions

From the detailed operations of "Onion" and "Onion+" in Algorithm 1, it can be observed that both algorithms share the following properties/strengths:

1) Due to their recursive nature, the numbers of rings generated by "Onion" and "Onion+" for an n×n chip can be easily calculated as follows:

$$N(\text{Onion}) = \begin{cases} \frac{1}{2}n \cdot (2n-3) & \text{if } n \text{ is even} \\ \frac{1}{2}(n-1) \cdot (2n-1) & \text{otherwise} \end{cases} \quad (1)$$

$$N(\text{Onion+}) = N(\text{Onion}) + 2\left\lfloor \frac{n}{4} \right\rfloor. \quad (2)$$

2) Consider the center of the n×n chip as the origin of the xy-plane. Each topology generated by "Onion" or "Onion+" (while ignoring ring direction) is symmetric with respect to the x-axis, y-axis and the origin. It also has 90 degrees of rotational symmetry. One key advantage of symmetrical topology is that the wiring resources on the chip can be utilized in a more balanced manner, e.g., the number of horizontal links utilized is the same as that of the vertical links. Another key advantage is that the number of rings passing through each core also tends to be balanced. This in turn can keep the die area required by different network interfaces comparable. For comparison, the topology found by "RLrec" is only symmetric with respect to y-axis (when the rotation of the inner topology is not used).

3) "Onion" consumes at most (n−1) links between adjacent cores. From Theorem 1, ω=n−1 is the minimum wiring constraint using rectangular rings.

Theorem 1: To realize routerless network-on-chip by rectangular rings in an n×n chip, the wiring constraint must satisfy ω≥n−1.

To prove Theorem 1, it is only required to prove that there is no feasible solution for ω<n−1 (as "Onion" has already provided a feasible solution for ω=n−1). The following focuses on the cores along the diagonal of the n×n square chip. Without loss of generality, each core is re-labeled by its location in the n×n grid network, e.g., the core at the top-left corner is (0, 0) and the core at the bottom-right corner is (n−1, n−1). Obviously, core (0, 0) needs at least (n−1) rectangular rings to communicate with the (n−1) diagonal cores located at (1, 1), (2, 2), (3, 3), ..., and (n−1, n−1). As a result, the number of rings pass through core (0, 0) is at least (n−1). Since core (0, 0) only has two adjacent cores, the number of links between core (0, 0) and each neighbor must be larger than (n−1). This shows that wiring constraint of ω<n−1 is infeasible. Theorem 1 is thus proved.

4) For "Onion" and "Onion+", their achieved minimum number of rings at each core both are (n−1). But their achieved maximum number of rings at each core are as follows:

$$M(\text{Onion}) = \begin{cases} 2n-3 & \text{if } n \text{ is even} \\ 2n-2 & \text{otherwise} \end{cases} \quad (3)$$

$$M(\text{Onion+}) = \begin{cases} 2n-2 & \text{if } n \text{ is odd} \\ 2n-1 & \text{if } n \bmod 4 = 0 \\ 2n-3 & \text{otherwise} \end{cases} \quad (4)$$

Note that for the "RLrec", the two values are n and 2(n−1) respectively, where n must be even.

5) While the topology obtained by "Onion" or "Onion+" is easy to predict (due to the systemic approach), it is challenging to derive an exact analytical expression for calculating the average core-to-core hop count. In the following, polynomial curve fitting is adopted to derive an analytical expression for the average hop count. It is shown that the average hop count increases only linearly with n.

III. Numerical Results

The performance of "Onion" and "Onion+" is compared with "RLrec" and "ILP". Note that "ILP" can provide optimal solutions if the chip size is small. (For solving "ILP", CPLEX 12.7 is adopted.) In the present embodiments of "Onion" and "Onion+", the optional direction tuning (as discussed later) is activated. Without loss of generality, the following disclosure only consider chips when n is even because "RLrec" only works for even n.

For each solution found, the following performance metrics are collected: core-to-core hop count, number of links per adjacent core pair, number of rings per core, shortest/longest ring, total ring length, and total number of rings. Among the metrics above, the primary objective is to minimize the core-to-core hop count (or the packet delay). Other performance metrics provide additional insights on wiring resources consumption (total ring length; number of links per adjacent core pair), network interface complexity (number of rings per core), and hard-wired routing table size (total number of rings; number of rings per core).

A. With a Fixed 6×6 Chip

This section focuses on a small, 6×6 chip multiprocessor. The four algorithms (two of the present embodiments and two known solutions) are compared. The four algorithms are "Onion", "Onion+", "RLrec" and "ILP"—an optimal "ILP" formulation using rectangular rings only. "ILP" solutions are used as the benchmark. Since "ILP" is too complicated to be solved when n is large, it is set that n=6, or a 6×6 chip. For "Onion", the wiring constraint is set to ω=5, while for "Onion+" and "RLrec", ω=6 is used. Optimal/"ILP" solutions are obtained for both ω=5 and ω=6. The detailed performance results are summarized in Table 2.

From Table 2, it can be seen that the maximum number of links between any pair of adjacent cores is always no bigger than the respective wiring constraint adopted. This verifies all algorithms function properly. With "Onion", the average core-to-core hop count obtained is 5.32, which is comparable with 5.31, optimal result obtained by "ILP" with ω=5. Both "Onion+" and "RLrec" assume the same wiring constraint of ω=6. The average core-to-core hop counts found using "Onion+", "RLrec" and "ILP" with ω=6 are 4.79, 50.07 and 4.76, respectively. It can be seen that "Onion+" outperforms "RLrec" by 5.5%, and its performance gap to optimal/"ILP" is less than 1%.

It should be noted that "Onion" and "Onion+" always consume less resources than "RLrec" because, from Table 2, they have smaller number of links per adjacent core pair, smaller number of rings per core, as well as smaller total ring length.

TABLE 2

Performance comparison based on a 6 × 6 chip.

| Performance | | Onion | Onion+ | RLrec | ILP ω = 5 | ILP ω = 6 |
|---|---|---|---|---|---|---|
| Core-to-core hop count | Max. | 15 | 15 | 15 | 15 | 15 |
| | Min. | 1 | 1 | 1 | 1 | 1 |
| | Avg. | 5.32 | 4.79 | 5.07 | 5.31 | 4.76 |
| # of links per adjacent core pair | Max. | 5 | 6 | 6 | 5 | 6 |
| | Min. | 2 | 2 | 2 | 2 | 2 |
| | Avg. | 4.07 | 4.60 | 4.67 | 4.0 | 4.73 |
| # of rings per core | Max. | 9 | 9 | 10 | 8 | 10 |
| | Min. | 5 | 5 | 6 | 5 | 5 |
| | Avg. | 6.78 | 7.76 | 7.78 | 6.67 | 7.89 |
| Ring length | Max. | 20 | 20 | 20 | 20 | 20 |
| | Min. | 4 | 4 | 4 | 4 | 4 |
| | Avg. | 9.04 | 9.52 | 11.67 | 10.0 | 10.52 |
| Total ring length | | 244 | 276 | 280 | 240 | 284 |
| Total # of rings | | 27 | 29 | 24 | 24 | 27 |

B. With Varying Chip Size

Figure 9:
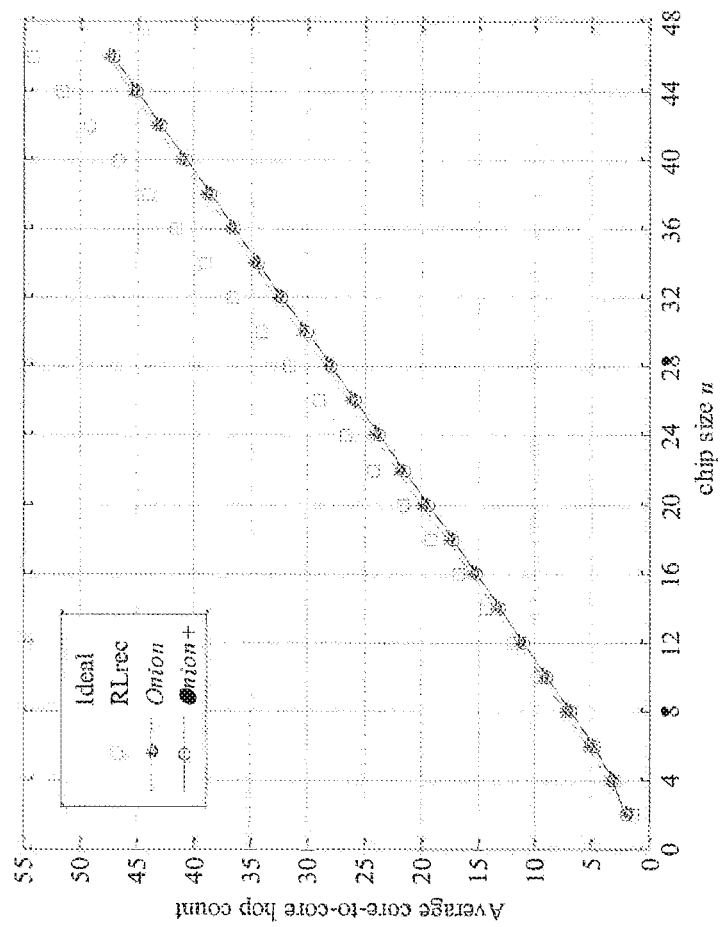
FIG. 9 is a graph showing average core-to-core hop count versus chip size n for the algorithm ("Onion" and "Onion+") of FIG. 7 and another existing method ("RLrec") in the art.

FIG. 9 shows the average core-to-core hop count versus n, where $n^2$ is the number of cores. In addition to "Onion", "Onion+" and "RLrec", the performance curve identified by Ideal (in green) is obtained by always using the shortest/Manhattan distance between any pair of cores. In practice, Manhattan distance is impossible to achieve unless wiring constraint ω is sufficiently large. That means Ideal serves as a (unachievable) performance lower bound. Here the (achievable) "ILP" solutions were not used because when n is large, solving "ILP" becomes intractable. (As discussed above, another strength of "Onion" is that with ω2(n−1), "Onion" can provide the shortest/Manhattan distance).

FIG. 9 shows that "Onion" and "Onion+" perform slightly worse than "RLrec" when n≥18/n≥4. However, when n becomes larger, both "Onion" and "Onion+" outperform "RLrec" and the performance gap increases with n. When n=46, or a chip with 2,116 cores, "Onion" and "Onion+" cut down the average core-to-core hop count by 12.06% and 13.04%, respectively.

Figure 10:
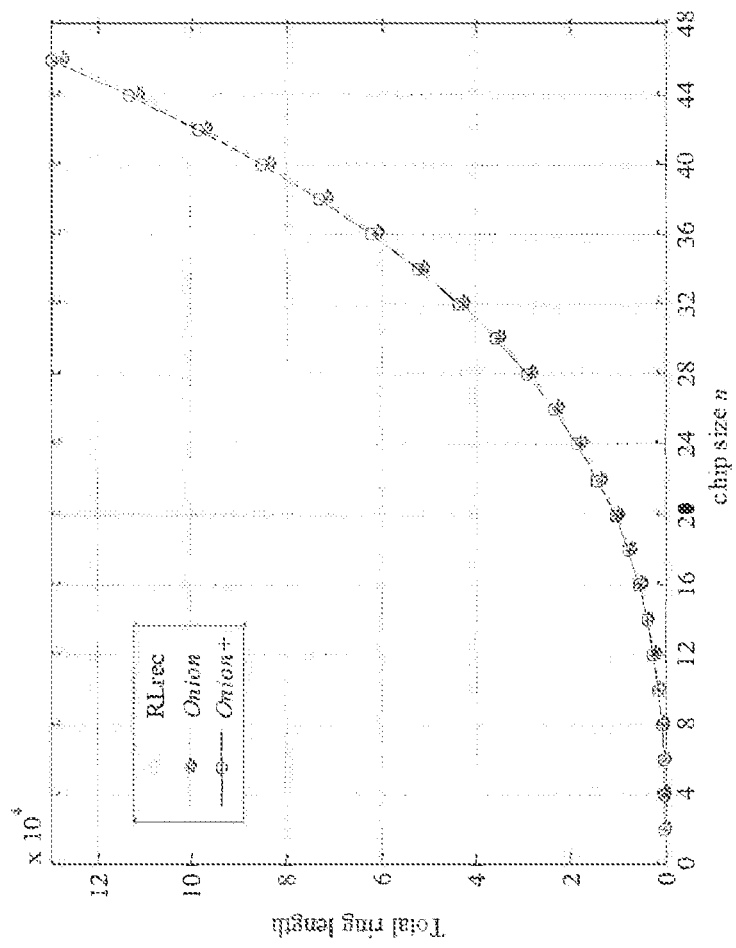
FIG. 10 is a graph of total ring length versus chip size n for the algorithm ("Onion" and "Onion+") of FIG. 7 and another existing method ("RLrec") in the art.
Figure 11:
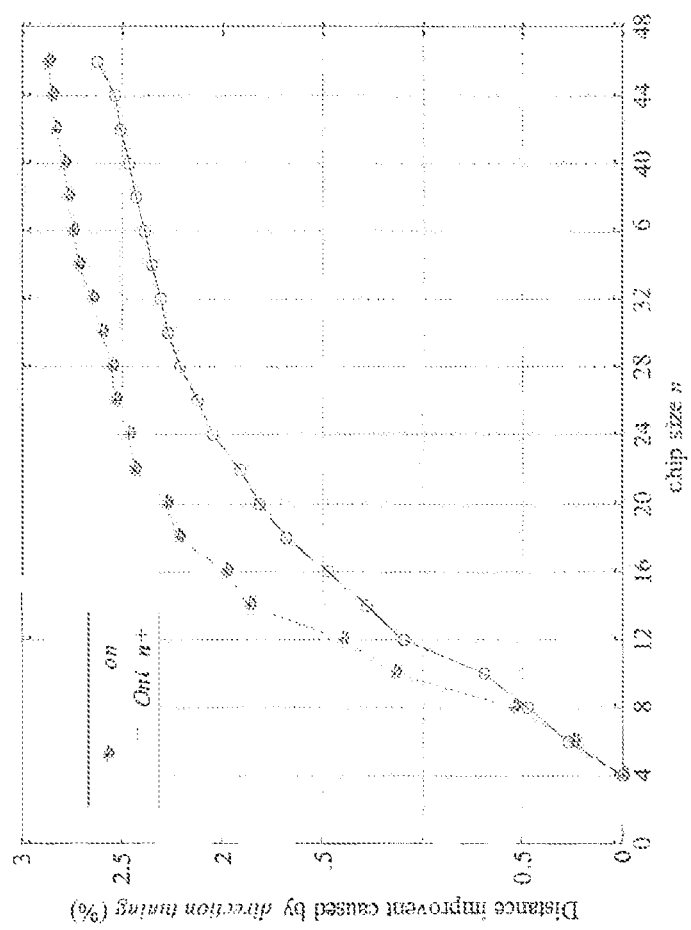
FIG. 11 is a graph showing distance improvement caused by direction tuning in the algorithm ("Onion" and "Onion+") of FIG. 7 in one embodiment of the invention.

FIG. 10 compares the total ring length consumed by "RLrec", "Onion" and "Onion+". It can be seen that "Onion" consumes slightly less total ring length than "RLrec" and "Onion+". This is because smaller wiring constraint (also means wiring resources) is used. As the total ring length increase due to "Onion+" is small, it can be seen that the curves of "RLrec" and "Onion+" almost overlap.

C. Effect of Direction Tuning

As stated above, the direction tuning is an optional step for both "Onion" and "Onion+", and is implemented as a greedy algorithm by Lines 19-22 in Algorithm 1 of FIG. 7. Here the percentage reduction in average core-to-core hop count due to direction tuning is studied. The direction tuning function in Algorithm 1 is enabled and disabled to get the following percentage reduction in average hop count.

$$\eta = \left(1 - \frac{d_{avr}(\text{with direction tuning})}{d_{avr}(\text{without direction tuning})}\right) \times 100\%. \quad (5)$$

Figure ii shows the distance improvement caused by the direction tuning. It can be seen that with the increase chip size n, the performance gain due to direction tuning increases slightly. When n=46, the percentage improvement is about 2.86% for "Onion" and 2.62% for "Onion+". Although the performance gain is very small, no extra wiring resources are consumed. One way for possible higher performance gain is to replace the greedy by a more sophisticated to algorithm, but the high efficiency of "Onion" would be sacrificed.

D. Polynomial Curve Fitting for "Onion" and "Onion+"

As it is challenging to derive an analytical model for "Onion" and "Onion+", polynomial curve fitting is adopted to evaluate the average core-to-core hop count. FIG. 12 shows the original data (the discrete green/red points) and the fitted curves (in black/blue). For "Onion", the error sum of squares (SSE) is 0.12. For "Onion+", its SSE is 0.29. The small SSE value indicates the excellent fitting. (6) and (7) give the polynomial expression for the two algorithms respectively. From them, it can be seen that the average core-to-core hop count increase almost linearly with n, where $n^2$ is the number of cores of a chip. This further validates the superior performance of the present "Onion" and "Onion+".

$$d_{avr}^{Onion}(n) = 3.58 \times 10^{-6} \times n^4 - 4.01 \times 10^{-4} \times n^3 + 1.58 \times 10^{-2} \times n^2 + 8.06 \times 10^{-1} \times n + 1.34 \times 10^{-1}. \quad (6)$$

$$d_{avr}^{Onion+}(n) = 5.91 \times 10^{-6} \times n^4 - 6.61 \times 10^{-4} \times n^3 + 2.58 \times 10^{-2} \times n^2 + 6.55 \times 10^{-1} \times n + 3.02 \times 10^{-1}. \quad (7)$$

Figure 14:
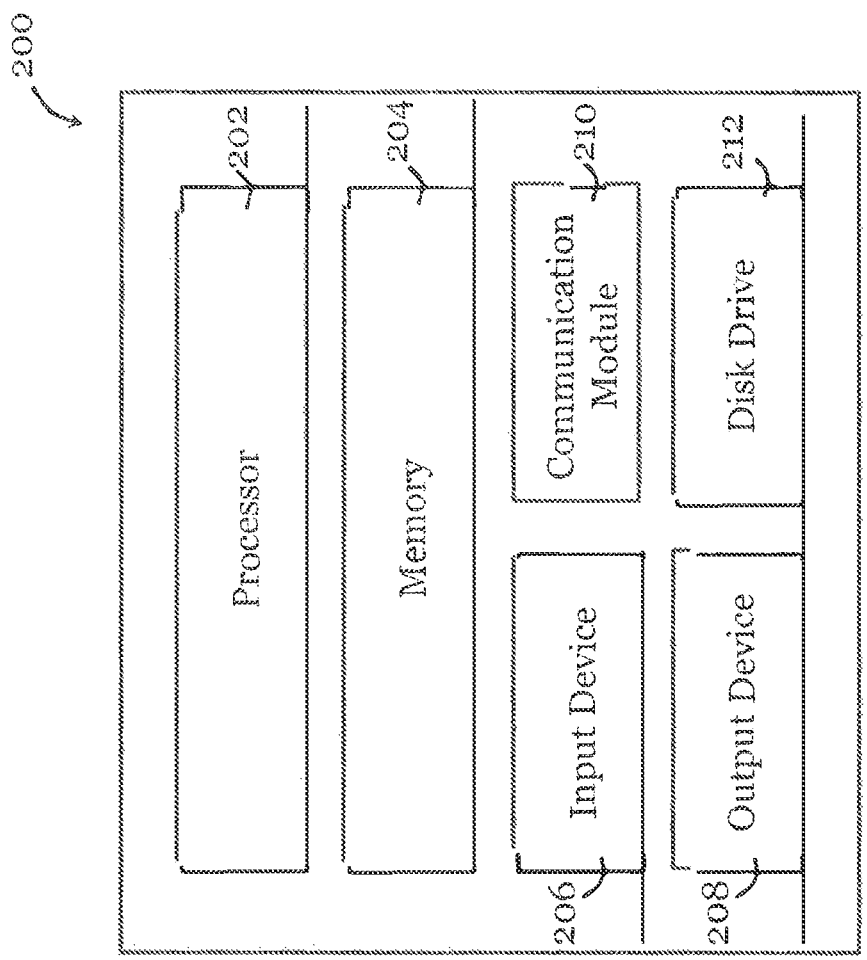
FIG. 14 is a block diagram of an information handling system operable for implementing the algorithm of FIG. 7 or the method of FIG. 13.

Referring now to FIG. 14, there is shown a schematic diagram of an exemplary information handling system 200 that can be used (1) for implementing the method for for determining a wiring network in a multi-core processor in one embodiment of the invention (e.g., the method of FIG. 7 or FIG. 13), and/or (2) for incorporating the multi-core processor in one embodiment of the invention. The information handling system 200 may have different configurations, and it generally comprises suitable components necessary to receive, store, and execute appropriate computer instructions, commands, or codes. The main components of the information handling system 200 are a processor 202 and a memory unit 204. The processor 202 may be formed by one or more CPU, MCU, controllers, logic circuits, Raspberry Pi chip, etc. The processor 202 may include the multi-core processor with the wiring to network determined using the method of the above embodiments. The memory unit 204 may include one or more volatile memory unit (such as RAM, DRAM, SRAM), one or more non-volatile unit (such as ROM, PROM, EPROM, EEPROM, FRAM, MRAM, FLASH, SSD, NAND, and NVDIMM), or any of their combinations. Preferably, the information handling system 200 further includes one or more input devices 206 such as a keyboard, a mouse, a stylus, an image scanner, a microphone, a tactile input device (e.g., touch sensitive screen), and an image/video input device (e.g., camera). The information handling system 200 may further include one or more output devices 208 such as one or more displays (e.g., monitor), speakers, disk drives, headphones, earphones, printers, 3D printers, etc. The display may include a LCD display, a LED/OLED display, or any other suitable display that may or may not be touch sensitive. In one example, the display may be used to display the wiring network determined using the method of the above embodiments. The information handling system 200 may further include one or more disk drives 212 which may encompass solid state drives, hard disk drives, optical drives, flash drives, and/or magnetic tape drives. A suitable operating system may be installed in the information handling system 200, e.g., on the disk drive 212 or in the memory unit 204. The memory unit 204 and the disk drive 212 may be operated by the processor 202. The information handling system 200 also preferably includes a communication module 210 for establishing one or more communication links (not shown) with one or more other computing devices such as servers, personal computers, terminals, tablets, phones, or other wireless or handheld computing devices. The communication module 210 may be a modem, a Network Interface Card (NIC), an integrated network interface, a radio frequency transceiver, an optical port, an infrared port, a USB connection, or other wired or wireless communication interfaces. The communication links may be wired or wireless for communicating commands, instructions, information and/or data. Preferably, the processor 202, the memory unit 204, and optionally the input devices 206, the output devices 208, the communication module 210 and the disk drives 212 are connected with each other through a bus, a Peripheral Component Interconnect (PCI) such as PCI Express, a Universal Serial Bus (USB), an optical bus, or other like bus structure. In one embodiment, some of these components may be connected through a network such as the Internet or a cloud computing network. A person skilled in the art would appreciate that the information handling system 200 shown in FIG. 14 is merely exemplary and different information handling systems 200 with different configurations may be applicable in the invention. The information handling system 200 can be implemented as a computer (desktop, laptop, tablet, etc.), a phone, a watch, wearable electronics, IoT device, etc. The information handling system 200 can be implemented as any communication system, device, etc.

Although not required, the embodiments described with reference to the Figures can be implemented as an application programming interface (API) or as a series of libraries for use by a developer or can be included within another software application, such as a terminal or personal computer operating system or a portable computing device operating system. Generally, as program modules include routines, programs, objects, components and data files assisting in the performance of particular functions, the skilled person will understand that the functionality of the software application may be distributed across a number of routines, objects or components to achieve the same functionality desired herein.

It will also be appreciated that where the methods and systems of the invention are either wholly implemented by computing system or partly implemented by computing systems then any appropriate computing system architecture may be utilized. This will include stand-alone computers, network computers, dedicated or non-dedicated hardware devices. Where the terms "computing system" and "computing device" are used, these terms are intended to include any appropriate arrangement of computer or information processing hardware capable of implementing the function described.

The above embodiments of the invention have provided systems and methods for designing a set of rectangular rings to realize routerless network-on-chip in any n×n chips. One of the methods uses an outside-in layered progressive model called "Onion" to design a set of rectangular (e.g., squared) rings for realizing routerless network-on-chip. Unlike existing algorithm such as "RLrec", "Onion" follows an outside-in layered progressive approach for constructing square rings from the four corners of the chip. For an n×n chip, "Onion" only requires a wiring constraint of $\omega=n-1$, the minimum wiring constraint required by using rectangular rings. A variant of "Onion", called "Onion+" is also provided. "Onion+" requires a wiring constraint of $\omega=n$ comparable with "RLrec". Both "Onion" and "Onion+" are scalable and can support chips with n×n cores, where n, m can be either even or odd. Both "Onion" and "Onion+" outperform "RLrec", and the performance gap increases with n. For example, when n=46, "Onion" and "Onion+" outperform "RLrec" by 12.06% and 13.04%, respectively. The methods in the above embodiments provide an optimal balance of core-to-core connectivity and the average hop count for all core pairs.

It will be appreciated by persons skilled in the art that numerous variations and/or modifications may be made to the invention as shown in the specific embodiments without departing from the spirit or scope of the invention as broadly described. The described embodiments of the invention should therefore be considered in all respects as illustrative, not restrictive. For example, while some of the above description focuses on an n×n array of processor cores, it should be noted that the invention is also applicable to n×m processor cores (where n and m are different). The network-on-chip as illustrated may be implemented as an integrated circuit or as a multi-core processor. Also, it is envisaged that the method of the invention is applicable to processor cores arranged in different forms of array that is not rectangular, but polygonal with three or more edges (e.g., triangular, quadrilateral, pentagonal, hexagonal, etc.), or rounded shape (e.g, circle, oval, ellipse, oblong, etc.), in which case the shape of the wiring paths are changed correspondingly.

What is claim is:

1. A computer-implemented method for determining a wiring network in a multi-core processor, comprising:
    determining, using a layered-and-progressive determination model, a wiring network including one or more wiring paths for operably connecting a plurality of processor cores in the multi-core processor; and
    outputting the determined wiring network for display;
    wherein the layered-and-progressive determination model is arranged to:
        model the plurality of processor cores as a mesh of nodes arranged in the form of a rectangular array with n rows and m columns, where n is an integer larger than 2 and m is an integer larger than 2;
        identity, from the rectangular array, one or more nested layers each formed by respective plurality of nodes connected in respective rectangular paths of the same shape but different sizes, the one or more nested layers include, at least, an outermost layer formed by all outermost nodes in the rectangular array;
        determine a respective rectangular wiring path for each of the one or more nested layers, wherein the respective rectangular wiring paths are of the same shape but different sizes;
        if the one or more nested layers includes two or more layers, determine, for each of the respective rectangular wiring path, for each respective corner node of the respective rectangular wiring path, one or more further rectangular wiring paths each connecting the respective corner node with at least one node in another one of the one or more nested layers, wherein the one or more further rectangular wiring paths for each respective corner node are of the same shape but different sizes; and
        form the wiring network using the respective rectangular wiring paths and, if the one or more nested layers includes two or more layers, the further rectangular wiring paths.

2. The computer implemented method of claim 1, wherein the layered-and-progressive determination model is further arranged to:
    determining respective direction of data flow in the respective rectangular wiring path for each of the one or more nested layers; and
    determining respective direction of data flow in the one or more further rectangular wiring paths for each respective corner node of the respective rectangular wiring path.

3. The computer implemented method of claim 2, wherein the layered-and-progressive determination model is further arranged such that:
    the direction of data flow in the respective rectangular wiring path for each of the one or more nested layers is determined to be in a first direction, and
    the respective direction of data flow in the one or more further rectangular wiring paths for each respective corner node of the respective rectangular wiring path is determined to be in a second direction opposite to the first direction.

4. The computer implemented method of claim 1, wherein the determination of the respective rectangular wiring path for each of the one or more nested layers is performed in an outside-in manner beginning with the nodes in the outermost layer.

5. The computer implemented method of claim 1, wherein the layered-and-progressive determination model is further arranged to: determine additional rectangular wiring paths for connecting the nodes in different layers, wherein the rectangular wiring paths are shaped differently than the respective rectangular wiring paths and the further rectangular wiring paths.

6. The computer implemented method of claim 1, further comprising:
    receiving one or more input parameters relating to a total number of processor cores in the multi-core processor; and the determination of the wiring network is performed based on the one or more received input parameters.

7. The computer implemented method of claim 1, wherein n and m are different.

8. The computer implemented method of claim 1, wherein n and m are the same, wherein the mesh of nodes are arranged in the form of a regular squared array, wherein the respective rectangular wiring paths and the further rectangular wiring paths, if present, are squared-shaped.

9. The computer implemented method of claim 1, wherein n is at least 4, at least 5, or at least 6; and m is at least 4, at least 5, or at least 6.

10. The computer implemented method of claim 1, wherein the layout of the determined wiring network includes all of the determined wiring paths superimposed with each other and on a model of the mesh.

11. The computer implemented method of claim 10, wherein the determined wiring network, when applied on the modelled mesh, has two axes of symmetry.

12. The computer implemented method of claim 1, wherein the layout of the determined wiring network is free of non-rectangular wiring paths.

13. The computer implemented method of claim 1, wherein the multi-core processor is routerless.

14. A system for determining a wiring network in a multi-core processor, comprising one or more processors arranged to perform the method of claim 1.

15. The system of claim 14, further comprising a display operably connected with the one or more processors for displaying the layout of the determined wiring network.

16. A non-transitory computer readable medium for storing computer instructions that, when executed by one or more processors, causes the one or more processors to perform the method of claim 1.

17. A multi-core processor comprising a plurality of processor cores operably connected with each other via a wiring network determined using the method of claim 1.

18. The multi-core processor of claim 17, further comprising a plurality of network interfaces each associated with a respective processor core for controlling data flow in the respective processor core.

19. An integrated circuit comprising the multi-core processor of claim 17.

20. An information handling system comprising the multi-core processor of claim 17.

* * * * *